United States Patent
Vermeersch et al.

(10) Patent No.: US 8,036,873 B2
(45) Date of Patent: Oct. 11, 2011

(54) EFFICIENT CLOCK MODELS AND THEIR USE IN SIMULATION

(75) Inventors: Dirk Vermeersch, San Jose, CA (US); Karl Van Rompay, Nieuwpoort (BE)

(73) Assignee: Synopsys, Inc., Mountain View, CA (US)

( * ) Notice: Subject to any disclaimer, the term of this patent is extended or adjusted under 35 U.S.C. 154(b) by 303 days.

(21) Appl. No.: 11/069,616

(22) Filed: Feb. 28, 2005

(65) Prior Publication Data

US 2006/0195310 A1    Aug. 31, 2006

(51) Int. Cl.
*G06F 17/50* (2006.01)
*G06F 1/04* (2006.01)

(52) U.S. Cl. .......................................... 703/19; 713/375

(58) Field of Classification Search ............... 703/19; 713/375; 709/248
See application file for complete search history.

(56) References Cited

U.S. PATENT DOCUMENTS

| | | | |
|---|---|---|---|
| 4,899,273 A * | 2/1990 | Omoda et al. ............... 703/14 |
| 5,502,689 A * | 3/1996 | Peterson et al. ............. 368/156 |
| 5,550,760 A * | 8/1996 | Razdan et al. .............. 703/14 |
| 5,694,579 A * | 12/1997 | Razdan et al. .............. 703/14 |
| 6,009,256 A * | 12/1999 | Tseng et al. ................ 703/13 |
| 6,058,492 A | 5/2000 | Sample et al. |
| 6,152,612 A * | 11/2000 | Liao et al. .................. 703/23 |
| 6,292,765 B1 | 9/2001 | Ho et al. |
| 6,625,572 B1 | 9/2003 | Zemlyak et al. |
| 6,789,219 B2 * | 9/2004 | Hapke et al. ................ 714/732 |
| 6,996,747 B2 * | 2/2006 | Swoboda et al. ............ 714/30 |
| 7,143,322 B2 * | 11/2006 | Hapke ......................... 714/724 |
| 7,203,632 B2 * | 4/2007 | Milne et al. ................. 703/14 |
| 7,277,839 B2 * | 10/2007 | Feldmann et al. ........... 703/13 |
| 2002/0069027 A1 * | 6/2002 | Hapke ......................... 702/117 |
| 2003/0093584 A1 * | 5/2003 | Bian ........................... 709/330 |
| 2003/0171908 A1 * | 9/2003 | Schilp et al. ................ 703/16 |
| 2004/0130558 A1 * | 7/2004 | MacInnis et al. ........... 345/629 |
| 2005/0081170 A1 * | 4/2005 | Hyduke et al. ............. 716/6 |
| 2005/0209839 A1 * | 9/2005 | Nightingale et al. ........ 703/19 |
| 2006/0195310 A1 * | 8/2006 | Vermeersch et al. ........ 703/19 |

FOREIGN PATENT DOCUMENTS

KR    1998-0032143    7/1998

OTHER PUBLICATIONS

Daniel Gracia Perez, Gilles Mouchard, Olivier Temem; A Fast SystemC Engine; Feb. 16, 2004; http://hal.inria.fr/inria-00001108/en/.*

Himanshu Bhatnagar; Advanced ASIC Chip Synthesis Using Synopsys® Design Compiler™ Physical Compiler™ and PrimeTime®; Second Edition; 2002; Springer; ISBN 978-0/7923-7644-6 (Print) 978-0-306-47507-8 (Online); pp. 4 and 5.*

Robert Siegmund, Dietmar Muller; SystemCSV: An Extension of SystemC for Mixed Multi-Level Communication Modeling and Interface-Based System Design; Feb. 2001, Proceedings of the Design, Automation and Test in Europe (Date) Conference; pp. 26-32.*

(Continued)

*Primary Examiner* — Paul Rodriguez
*Assistant Examiner* — Juan C Ochoa

(57) ABSTRACT

Methods simulating a system of devices are described. A model that simulates the system is executed. The system model includes a plurality of modules. A clock object for a module can be disabled when it is not needed or not being used.

21 Claims, 5 Drawing Sheets

OTHER PUBLICATIONS

Ernst Ulrich and Dennis Hebert, Speed and accuracy in digital network simulation based on structural modeling, 1982, Proceedings of the 19th conference on Design automation, ISBN:0-89791-020-6, pp. 587-593.*

C. A. Valderrama et al.; "Automatic Generation of Interfaces for Distributed C-VHDL Cosimulation of Embedded Systems: an Industrial Experience"; Jun. 19-21, 1996; Rapid System Prototyping; Proceedings of the Seventh IEEE International Workshop on Thessaloniki, Greece; pp. 72-77.*

Andrew S. Tanenbaum, "Structured Computer Organization", © 1984, pp. 10-12.*

* cited by examiner

EFFICIENT CLOCK MODELS AND THEIR USE IN SIMULATION

BACKGROUND OF THE INVENTION

1. Field of the Invention

Embodiments in accordance with the present invention generally pertain to electronic design automation. In particular, embodiments in accordance with the present invention pertain to simulation models used for system-level modeling.

2. Related Art

A system on a chip (SOC) may be relatively large and complex, incorporating multiple processors as well as other devices that support display, memory and keypad capabilities. System-level models are used to simulate systems such as SOCs during the design process (e.g., before they are implemented in hardware). Using system-level simulation, software that will run on systems such as SOCs can be designed and tested in parallel with the hardware design.

The computational complexity of system-level simulation models means that the simulation runs slower relative to the speed of execution of an actual hardware platform. Increasing the speed of simulation is one of the goals of model designers.

In simulation, clocks are normally modeled as modules that update a signal based on the clock's properties (e.g., period and duty cycle). This can mean that a clock model will generate an event for the falling edge and rising edge of the clock being modeled. For example, in SystemC coding:

```
void clock_gen( ) {
    While (true) {
        clk = true;
        wait(negedge_time);
        clk = false;
        wait(posedge_time);
    }
}
```

According to the above, the simulation kernel will have activity for every event. Even if the clock is the only module in the system, the maximum simulation speed (in cycles per second) is limited by how fast the kernel can schedule and run the clock process.

Higher performance modeling can be achieved by not using a clock object and letting the simulation advance in steps larger than one clock tick. That is, instead of running the simulation at every clock cycle or edge, larger time steps can be used. For example:

```
void process( ) {//process sensitive to some start of transaction
            event
...
// wait for one clock
wait(10,SC_NS); //no clock port, wait based on time (10 nanoseconds)
...
}
```

While larger time steps can accelerate execution of the simulation, this is balanced by a loss of accuracy. Developers of new products (software or hardware) are interested in seeing simulation results that are as realistic as can be reasonably expected, and so a loss of accuracy may not be tolerable. To achieve the desired accuracy, some devices in a system such as an SOC may be simulated using smaller time steps. Consequently, the simulation will proceed more slowly, because the speed of the system simulation will be limited by the slowest of the device simulations.

SUMMARY OF THE INVENTION

Accordingly, a method and/or system for improving the performance of system-level simulation models would be advantageous. In particular, a simulation that can be performed more quickly and with more accuracy than conventionally possible would be advantageous. Embodiments in accordance with the present invention provide this and other advantages.

Embodiments in accordance with the present invention pertain to a system-level simulation model that includes clock objects that can be disabled when they are not being used during simulation. More specifically, a clock object is built that automatically turns itself off or on based on whether any of the simulation processes is sensitive to the clock object. In one embodiment, a clock object can determine from the simulation whether it should be enabled or disabled. Alternatively, a user can indicate whether certain simulation processes are sensitive to a clock and for how long.

According to embodiments of the present invention, a first device model in a system of devices can be simulated using time steps of one length (e.g., larger time steps), and a second device model in that system can be simulated using time steps of another (e.g., shorter) length. The second device model may be used to simulate a new hardware device, or to simulate execution of a new software application on a particular device—generally speaking, the second device model is used when greater simulation accuracy is desired for a particular device in a system of devices. During times that the second device model is active during simulation, the system-level model executes using shorter time steps, but during times that the second device model is not active during simulation, the clock object for the second device model is disabled and the system-level model executes using larger time steps. Thus, higher accuracy can be achieved using the second device model, but overall performance of the system-level model is only affected when the second device model is active. Thus, the simulation model can be executed more quickly and with greater accuracy than conventional models.

There are other advantages associated with embodiments in accordance with the present invention. For example, the design of timer models is facilitated, and modeling with the present invention clock objects is a modeling style readily adoptable by designers. These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "disabling" or "enabling" or "monitoring" or "receiving" or "maintaining" or the like, refer to the actions and processes of a computer system (e.g., flowchart 500 of FIG. 5), or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
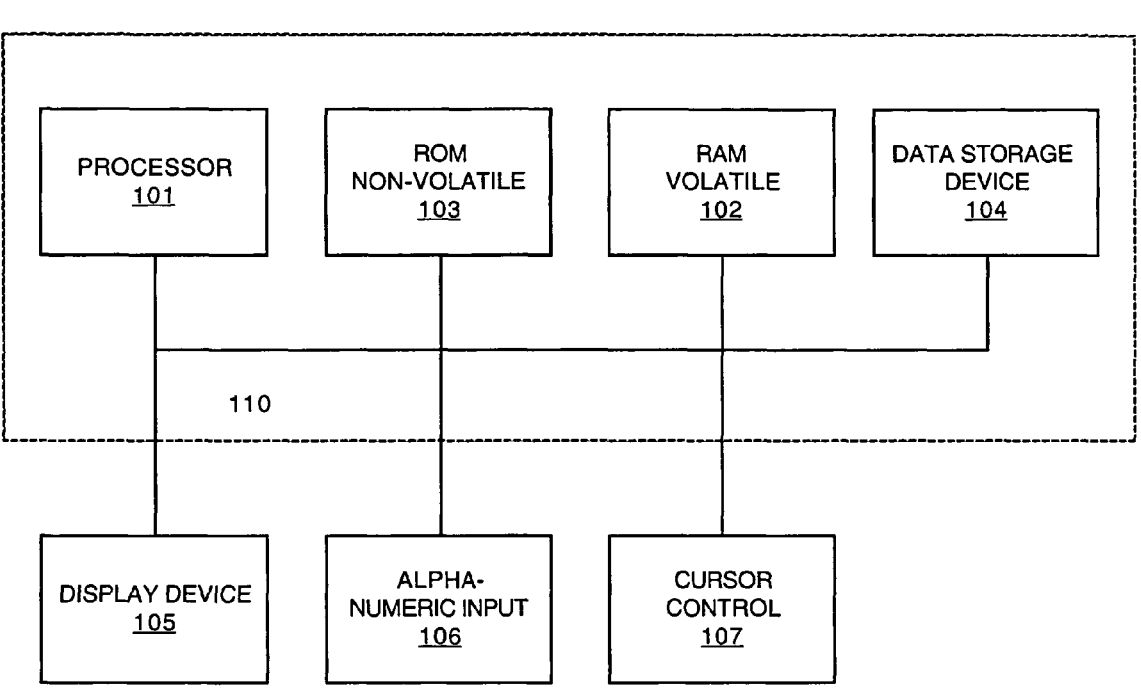
FIG. 1 is a block diagram of a device upon which embodiments of the present invention can be implemented.

FIG. 1 is a block diagram of a device 100 upon which embodiments of the present invention can be implemented. In general, device 100 comprises bus 110 for communicating information, processor 101 coupled with bus 110 for processing information and instructions, random access (volatile) memory 102 coupled with bus 110 for storing information and instructions for processor 101, read-only (non-volatile) memory 103 coupled with bus 110 for storing static information and instructions for processor 101, data storage device 104 such as a magnetic or optical disk and disk drive coupled with bus 110 for storing information and instructions, an optional user output device such as display device 105 coupled to bus 110 for displaying information to the computer user, an optional user input device such as alphanumeric input device 106 including alphanumeric and function keys coupled to bus 110 for communicating information and command selections to processor 101, and an optional user input device such as cursor control device 107 coupled to bus 110 for communicating user input information and command selections to processor 101.

Display device 105 utilized with device 100 may be a liquid crystal device, cathode ray tube, or other display device suitable for creating graphic images and alphanumeric characters recognizable to the user. Cursor control device 107 allows a user to dynamically signal the two-dimensional movement of a visible symbol (pointer) on a display screen of display device 105.

Embodiments in accordance with the present invention are described primarily in the context of SystemC. However, features of the present invention are well suited for use in simulation models based on a hardware description language (HDL) such as VeriLog or Very High Speed Integrated Circuit (VHSIC) Hardware Description Language (VHDL).

Figure 2:
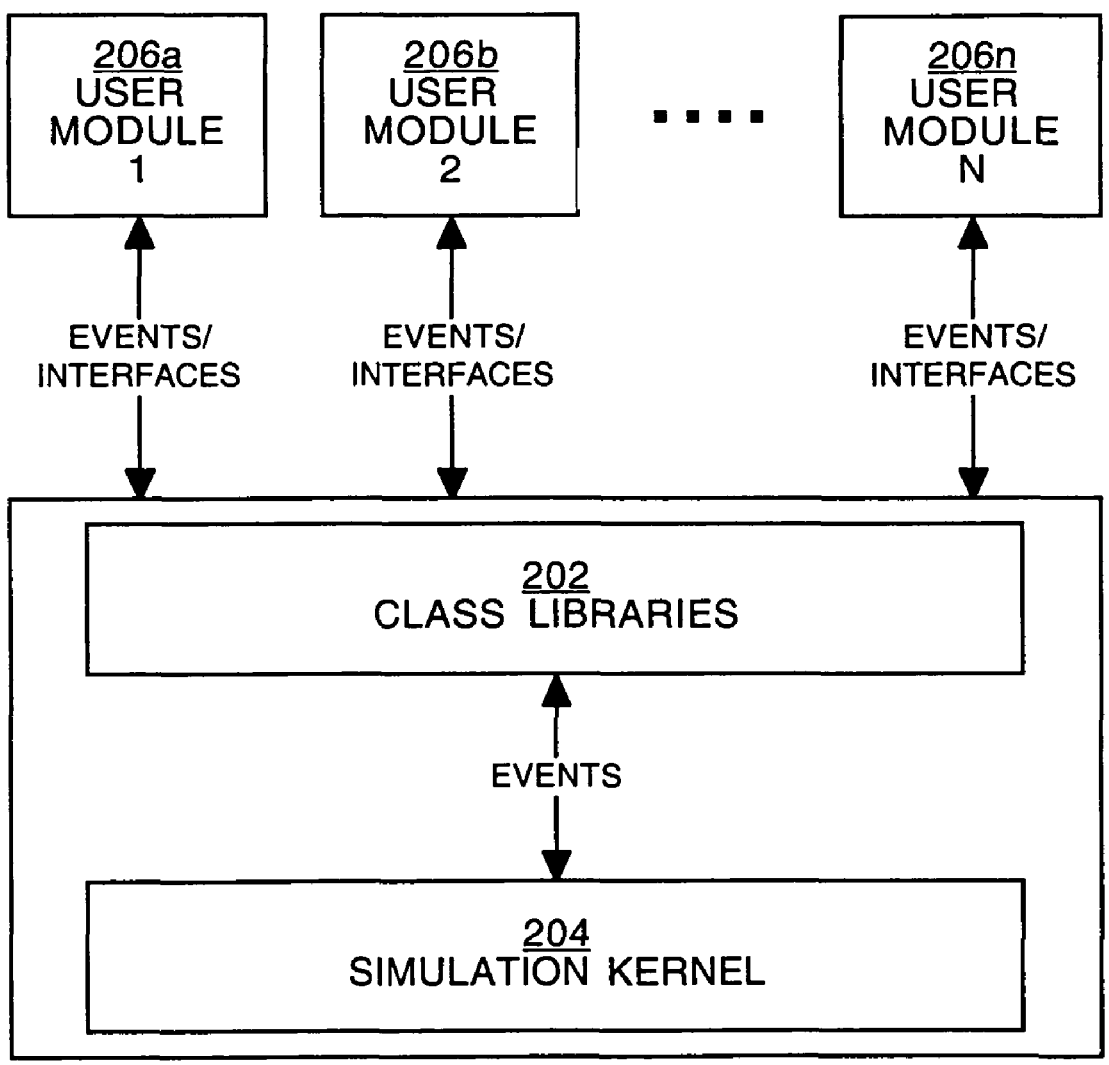
FIG. 2 is a block diagram of a simulation model according to one embodiment of the present invention.

FIG. 2 is a block diagram of a simulation model 200 according to one embodiment of the present invention. In the example of FIG. 2, the model 200 includes class libraries 202, a simulation kernel 204 and a number of user modules 206a, 206b, . . . , 206n. A system-level simulation model can include elements in addition to those shown in FIG. 2.

In the present embodiment, modeling constructs in model 200 are provided as C++ class libraries 202. Simulation kernel 204 is, in one example, computer-implemented code that models the passing of time and calls processes to calculate their outputs whenever their inputs change.

In one embodiment, simulation model 200 is a system-level design tool. System-level modeling includes modeling of systems above the RTL (Register Transfer Level) of abstraction, including systems that may be implemented in hardware or software or some combination of hardware and software. System-level design tools are used for modeling relatively large and complex systems such as systems on chips (SOCs). To model such systems, simulation model 200 utilizes a structural design hierarchy that is built using "modules" (e.g., user modules 206a, 206b, . . . , 206n). In essence, modules 206a, 206b, . . . , 206n allow pieces of a design to be worked on separately. One user module may represent a central processing unit (CPU), another may represent a digital signal processor (DSP), yet another may represent a peripheral device (e.g., a keyboard, a memory device, a display device, etc.), and so on.

Modules 206a, 206b, . . . , 206n may contain "processes" and instances of other modules. Data is communicated between modules using "ports" and "channels."

A process is, in one example, an independent thread of control which resumes execution when some set of "events" occur or some signals change, and then suspends execution after performing some action. In one embodiment, a "wait( )" call is used to achieve this suspension. A wait( ) call suspends execution of a thread. The argument or arguments passed to the wait( ) call determine when execution of the thread is resumed.

A port is an object through which a module can access a channel's interface. A channel is an object that serves as a container for communication and synchronization. Processes are contained in the modules 206a, 206b, . . . , 206n and access external channels through the ports of a module. Channels implement one or more "interfaces." An interface specifies a set of access methods to be implemented within a channel.

An "event" is a low-level synchronization primitive that is used to construct other forms of synchronization. A process can be "sensitive" to a set of events. The "sensitivity" of a process defines when the process will be resumed or activated; sensitivity is analogous to an activating condition.

When a specified event (or events) is triggered, an associated process is resumed or activated.

In one embodiment, sensitivity may be "static" or "dynamic." Prior to the start of the simulation, statically sensitive processes are made sensitive to a fixed set of signals, which cannot be changed once simulation has started. Static sensitivity is supported with a "sensitivity list" for each process in a module.

The sensitivity (activating condition) of a dynamically sensitive process can be altered during simulation. In one embodiment, the arguments of the wait( ) call are used to specify the events and signals to which a process is dynamically sensitive. As a process executes, using a wait( ) call, the process can dynamically select the set of events that will cause the process to resume after it has been suspended. Alternatively, instead of waiting on an event or events, a process can wait for a specified amount of time.

A process with static sensitivity can become dynamically sensitive using a wait( ) call with arguments. A process that is dynamically sensitive can become statically sensitive using a wait( ) call without arguments.

Figure 3:
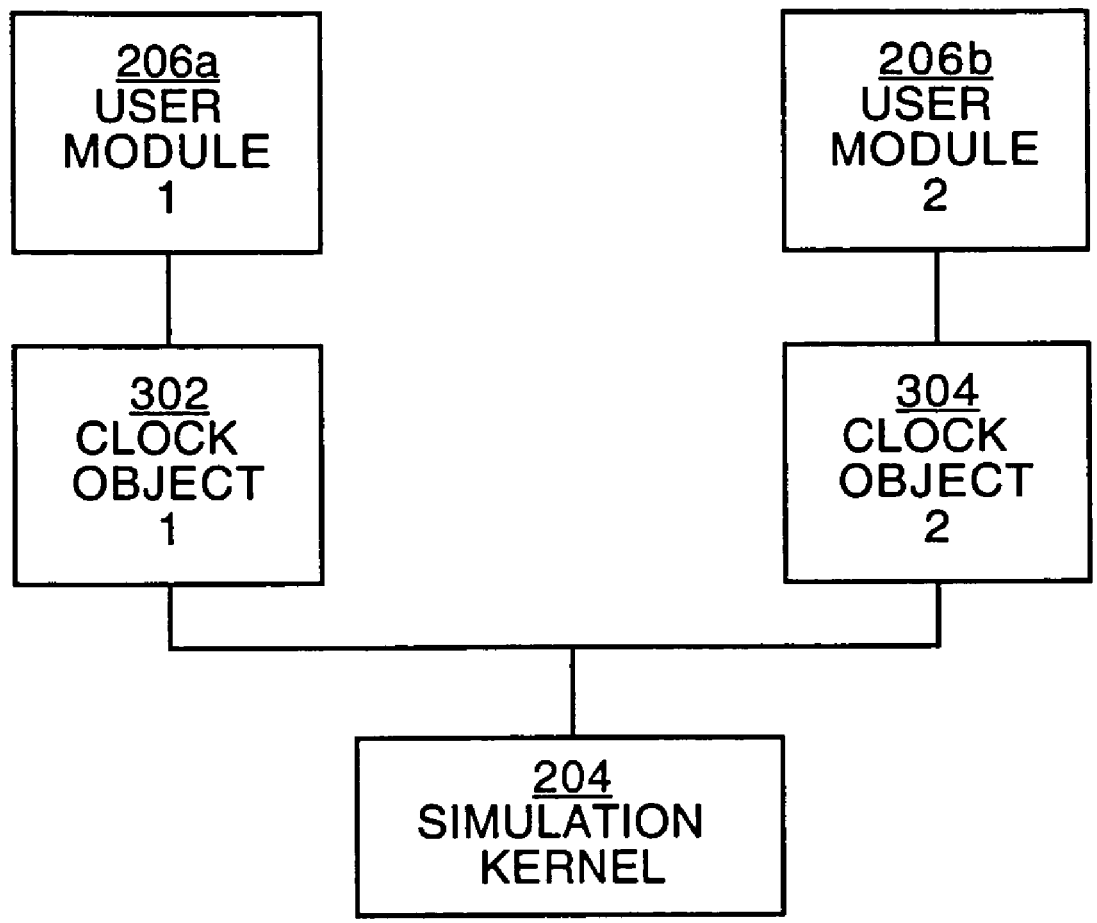
FIG. 3 is a block diagram of a clock object used in a simulation model according to one embodiment of the present invention.

FIG. 3 is a block diagram of a clock object used in a simulation model according to one embodiment of the present invention. In the example of FIG. 3, a first clock object 302 is associated with user module 206a and a second clock object 304 is associated with user module 206b. Although in the example of FIG. 3 there is one clock object per module, the present invention is not so limited. For example, a single clock object can be associated with more than one module.

According to embodiments of the present invention, the clock objects 302 and 304 can be enabled and disabled depending on whether any processes in the respective user modules are sensitive to it. For example, user module 206b may be associated with a device (e.g., a peripheral device) for which a greater degree of accuracy is desired during simulation. Accordingly, clock object 304 (associated with user module 206b) will have a longer clock enablement period than clock object 302. That is, clock object 304 will advance fewer clock cycles at a time than clock object 302. Put yet another way, clock object 304 implements shorter time steps during simulation than does clock object 302. When at least one process of user module 206b is sensitive to clock object 304, then clock object 304 is enabled so that the device associated with user module 206b is simulated with the desired level of accuracy. When no processes of user module 206b are sensitive to clock object 304, then clock object 304 can be disabled. Accordingly, the simulation model can execute more quickly. That is, the speed of the simulation is limited by clock object 304 when that clock object is enabled.

In one embodiment, a wait( ) call is used to indicate whether or not a process is sensitive to a clock object. In a wait(clk) call associated with a thread, a clock signal is one of the arguments that determines when that thread can resume execution. According to one embodiment of the present invention, using a wait(clk) call, a clock object becomes aware that a process is sensitive to the clock object. The absence of such a wait call serves to automatically inform the clock object that the process is not (or is no longer) sensitive to the clock object.

For example, assume that, for simulation purposes, user module 206a is associated with a CPU and clock object 302 advances 100 cycles at time, while user module 206b is associated with a peripheral device and clock object 304 advances 10 cycles at a time. While clock object 304 is enabled, the simulation advances 10 cycles at a time, but while clock object 304 is disabled, the simulation advances 100 cycles at a time. By disabling clock object 304 when it is not needed, the simulation can be advanced more quickly. When clock object 304 is enabled, the simulation advances more slowly, but with greater accuracy.

Continuing with the example above, a model of a CPU can be expressed as follows:

```
void process( ){
    while (true){
        //process as many cycles as possible until, for example, a
            maximum time or shared memory access is reached
        ...
        //block for the number of cycles consumed
        wait(n)
    }
}
```

A model of a peripheral (addressed by the CPU) can be expressed as follows:

```
void process( ){//sensitive to a clock gate controlled by
        transaction start/finish
    //perform a calculation
    wait(10);//allow 10 cycles for the calculation
    //disable the clock
}
```

In the example above, the simulation kernel 204 will advance "n" cycles (n ≦100). If the number of cycles is not limited because a maximum time or shared memory access is reached, for example, then simulation kernel 204 can advance the entire 100 cycles. If the peripheral gets accessed, then simulation kernel 204 will advance 10 cycles at a time.

Figure 4:
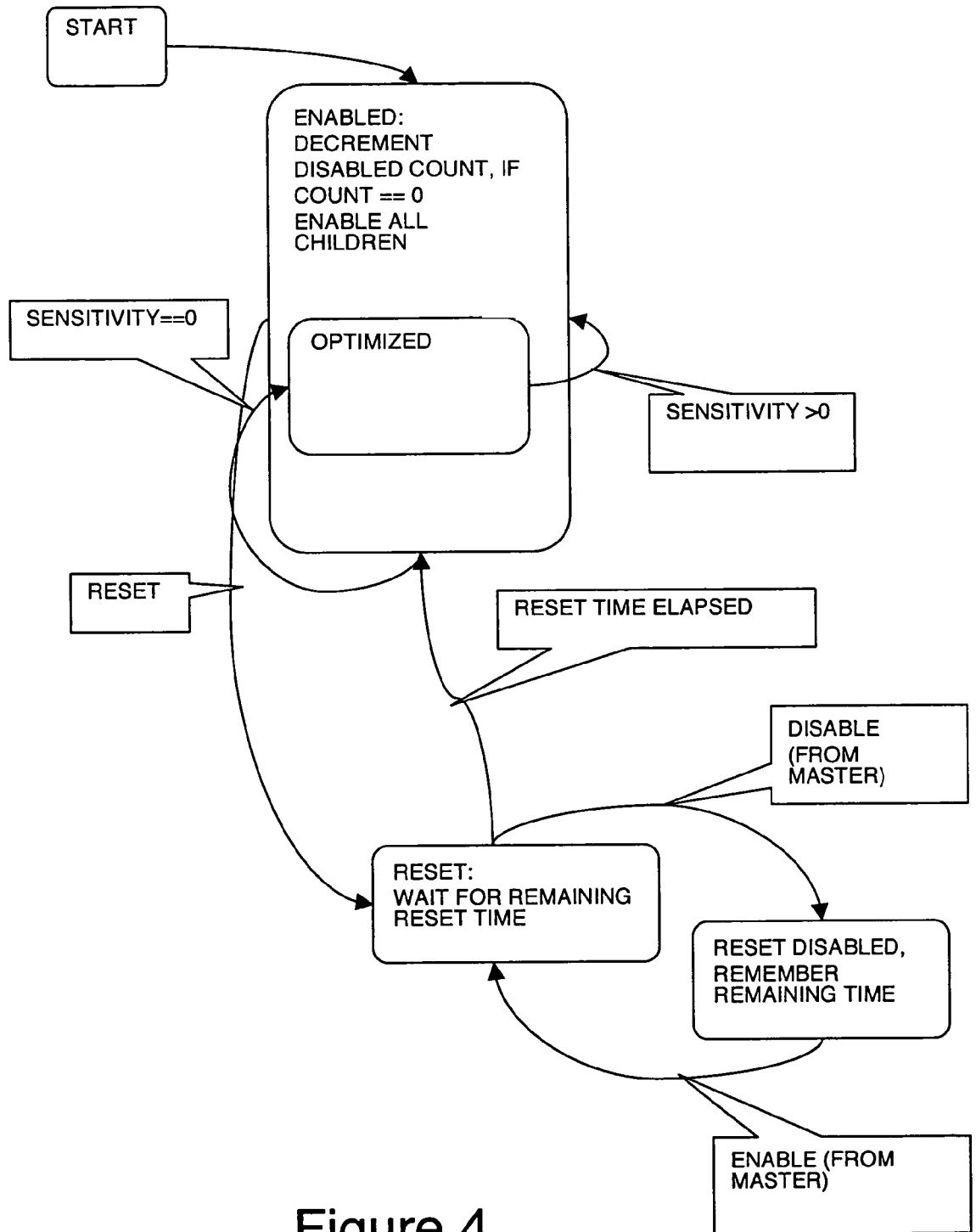
FIG. 4 is a state diagram of a clock object according to one embodiment of the present invention.

FIG. 4 is a state diagram of a clock object according to one embodiment of the present invention. In FIG. 4, the "optimized" state refers to the state in which the clock with the longest clock enablement period (e.g., clock object 304 in the example of FIG. 3) is disabled.

According to an embodiment of the present invention, a clock object is built with the following functions: enable( ); disable( ); and reset (int n cycles). The enable function is used to enable a clock (and its derived, or children, clocks). The disable function is used to disable a clock. The reset function is equivalent to disable and enable, but after n cycles.

According to the embodiment of FIG. 4, a count is made of the number of times the clock is enabled or disabled. Thus, for example, if a clock is disabled two times consecutively, then the clock needs to be enabled two times consecutively before the clock can be enabled.

Typically, there are three events associated with a clock: a positive edge (e.g., false to true), a negative edge (e.g., true to false), and a value-changed event. In one embodiment, a clock object will monitor the processes sensitive to those events. The clock object will automatically disable itself when no processes are sensitive to it, and will automatically enable itself if one or more processes are sensitive to it.

As mentioned above, in one embodiment, there are two types of sensitivity: static and dynamic. A clock can be associated with both statically-sensitive and dynamically-sensitive processes at the same time. For static sensitivity, the clock object keeps track of how many processes are sensitive to it. In one embodiment, a counter is implemented for statically-sensitive processes that are sensitive to the clock. When a clock-sensitive process is changed from static sensitivity to dynamic sensitivity, the count is decremented; and when a process is changed from dynamic sensitivity to static sensitivity, the count is incremented. When the count is zero, the clock can be disabled if there are no dynamically-sensitive processes associated with the clock.

For dynamic sensitivity, the clock object maintains flags for two events: positive edge, and negative edge. That is, for dynamic sensitivity, there is no need for a counter. In one embodiment, a flag for positive edge dynamic sensitivity is set when a process becomes dynamically sensitive to a positive edge event (or to a value-changed event), and a flag for negative edge dynamic sensitivity is set when a process becomes dynamically sensitive to a negative edge event (or to a value-changed event). For dynamic sensitivity, the flags are cleared when the respective event is triggered. For example, the flag for positive edge-sensitive dynamic processes is cleared when a positive edge event of the clock triggers, and the flag for negative edge-sensitive processes is cleared when a negative edge event of the clock triggers.

Figure 5:
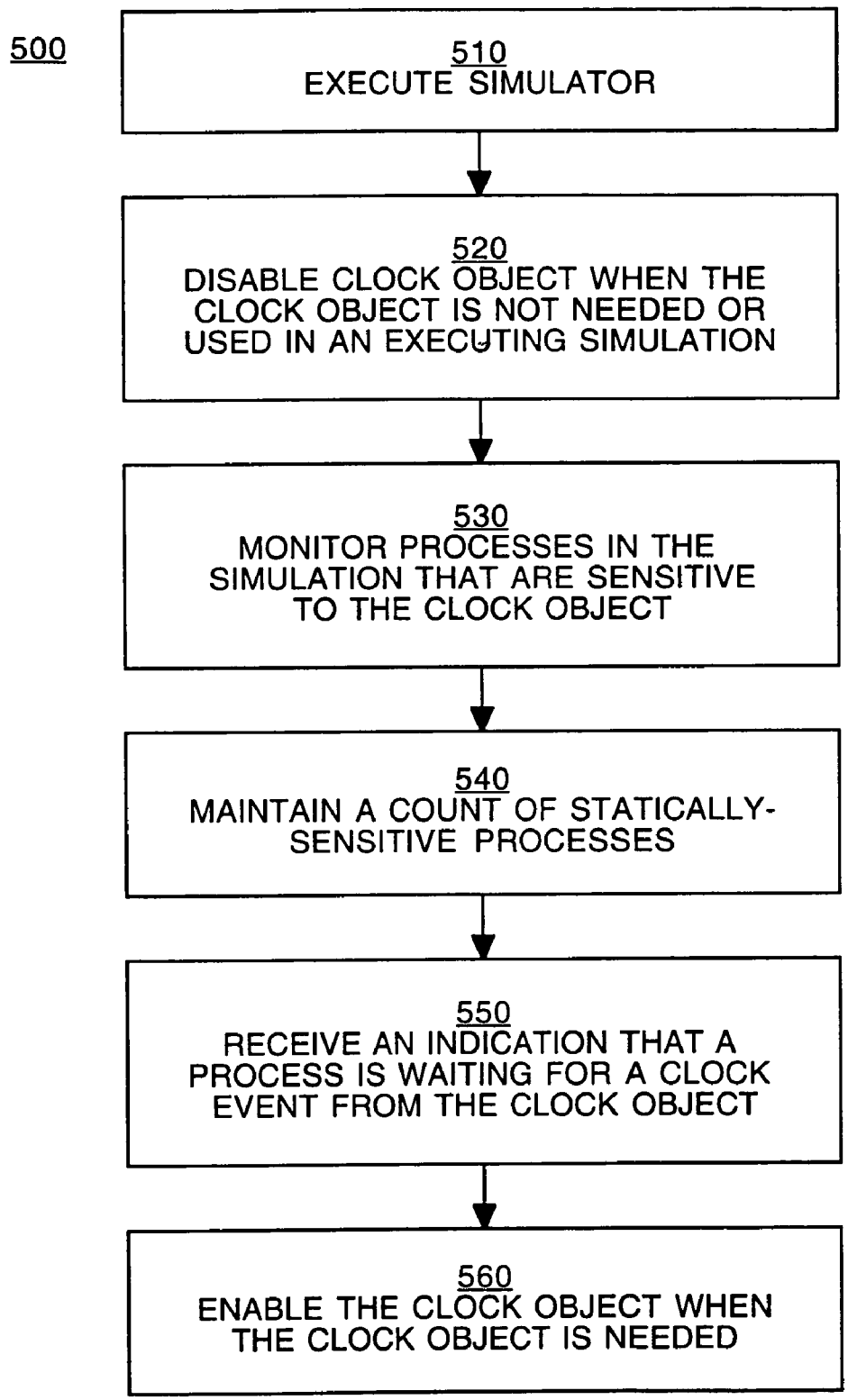
FIG. 5 is a flowchart of a computer-implemented method for simulating a system of devices according to one embodiment of the present invention.

FIG. 5 is a flowchart of a computer-implemented method for simulating a system of devices according to one embodiment of the present invention. Although specific steps are disclosed in flowchart 500, such steps are exemplary. That is, embodiments of the present invention are well suited to performing various other steps or variations of the steps recited in flowchart 500. It is appreciated that the steps in flowchart 500 may be performed in an order different than presented, and that not all of the steps in flowchart 500 may be performed. Flowchart 500 includes processes of the present invention which, in one embodiment, are carried out by a processor under the control of computer-readable and computer-executable instructions. The computer-readable and computer-executable instructions reside, for example, in data storage features such as computer usable volatile memory 102, computer usable non-volatile memory 103, and/or data storage device 104 of FIG. 1. The computer-readable and computer-executable instructions are used to control or operate in conjunction with, for example, processor 101 of FIG. 1.

In step 510 of FIG. 5, in one embodiment, a system model that simulates a system (e.g., model 200 of FIG. 2) is executed. In one such embodiment, the system model includes a number of modules (e.g., modules 206a, 206b, . . . , 206n of FIG. 2).

In step 520 of FIG. 5, in one embodiment, a clock object for a module that is inactive in the executing simulation is disabled when the clock object is not needed by or being used in an executing simulation.

In one embodiment, in step 530, processes in a module that are sensitive to the clock object are monitored, and the clock object is disabled when no processes are sensitive to the clock object (e.g., no processes are waiting for a clock event from the clock object).

In one embodiment, the system model is compliant with, or substantially compliant with, SystemC (e.g., SystemC 2.0, or a version of SystemC having a higher version number) and as such includes both statically-sensitive processes and dynamically-sensitive processes. In such an embodiment, in step 540, a count of statically-sensitive processes is maintained, and the clock object is disabled when the count is zero and when no dynamically-sensitive processes are associated with the clock object.

In one embodiment, in step 550, a wait( ) call is used to provide an indication that a process in the simulation that is sensitive to the clock object is no longer sensitive to the clock object. That is, a wait(clk) call provides an indication that a process in the module is waiting for a clock event from the clock object; the absence of such a wait call indicates that no processes are sensitive to the clock object.

If the disabled clock is a clock that, in the real world, operates at a higher frequency and thus slows simulation speed, then the simulation model can execute more quickly while maintaining the desired level of accuracy for the active modules of the simulation model.

In step 560, if the user module associated with the disabled clock becomes active, the disabled clock can be enabled. More specifically, if a process that is sensitive to the clock object is waiting for a clock event from the clock object, then the clock object can be enabled.

In summary, embodiments in accordance with the present invention can improve the performance of system-level simulation models. A clock that, in the real world, operates at higher frequencies (and thus slows the speed of simulation) can be used when greater accuracy is desired for a particular user module. When that user module is not active, that clock can be disabled, so that the simulation of other user modules can be accomplished in larger time steps. Thus, embodiments in accordance with the present invention balance both speed and accuracy, providing accuracy when desired or needed, and providing speed when permitted.

Embodiments of the present invention are thus described. While the present invention has been described in particular embodiments, it should be appreciated that the present invention should not be construed as limited by such embodiments, but rather construed according to the below claims.

What is claimed is:

1. A computer-implemented method of simulating a system of devices, said method comprising:

executing a system model comprising a plurality of software modules including a first module representing a first device of said devices and a second module representing a second device of said devices, wherein a first software clock object is associated with said first module and a second software clock object is associated with said second module and wherein said second software clock object advances fewer clock cycles per unit of time during a simulation relative to said first software clock object, said simulation performed using said system model;

during said simulation, monitoring said first module to determine if said first module is active and monitoring said second module to determine if said second module is active; and during said simulation, using said second software clock object to drive both said first and second modules when both said first and second modules are active, using said second software clock object to drive said second module when said second module is active but said first module is inactive, and disabling said second software clock object and using said first software clock object to drive said first module when said first module is active but said second module is inactive.

2. The method of claim 1 further comprising monitoring processes in said simulation that are sensitive to said second software clock object, wherein said second software clock object is disabled when no processes are sensitive to said second software clock object.

3. The method of claim 1 further comprising receiving an indication that a process in said simulation that is sensitive to said second software clock object is no longer sensitive to said second software clock object.

4. The method of claim 1 further comprising enabling said second software clock object for said second module in response to said second module becoming active.

5. The method of claim 1 further comprising receiving an indication that a process in said simulation is waiting for a clock event from said second software clock object.

6. The method of claim 1 wherein said system model is constructed in a language substantially compliant with SystemC and comprises statically-sensitive processes and dynamically-sensitive processes.

7. The method of claim 6 further comprising maintaining a count of statically-sensitive processes, wherein said second software clock object is disabled when said count is zero and no dynamically-sensitive processes are sensitive to said second software clock object.

8. A computer-usable non-transitory medium having computer-readable program code embodied therein for causing a computer system to execute a method for simulating a system of devices, said method comprising:

executing a system model comprising a plurality of software modules including a first module representing a first device of said devices and a second module representing a second device of said devices, wherein a first software clock object is associated with said first module and a second software clock object is associated with said second module, and wherein said second software clock object advances fewer clock cycles per simulation unit of time during a simulation relative to said first software clock object, said simulation performed using said system model;

during said simulation, monitoring said first module to determine if said first module is active and monitoring said second module to determine if said second module is active; and during said simulation, using said second software clock object to drive both said first and second modules when both said first and second modules are active, using said second software clock object to drive said second module when said second module is active but said first module is inactive, and disabling said second software clock object and using said first software clock object to drive said first module when said first module is active but said second module is inactive.

9. The computer-usable non-transitory medium of claim 8 wherein said method further comprises monitoring processes in said simulation that are sensitive to said second software clock object, wherein said second software clock object is disabled when no processes are sensitive to said second software clock object.

10. The computer-usable non-transitory medium of claim 8 wherein said method further comprises receiving an indication that a process in said simulation that is sensitive to said second software clock object is no longer sensitive to said second software clock object.

11. The computer-usable non-transitory medium of claim 8 wherein said method further comprises enabling said second software clock object for said second module in response to said second module becoming active.

12. The computer-usable non-transitory medium of claim 8 wherein said method further comprises receiving an indication that a process in said simulation is waiting for a clock event from said second software clock object.

13. The computer-usable non-transitory medium of claim 8 wherein said system model is constructed in a language substantially compliant with SystemC and comprises statically-sensitive processes and dynamically-sensitive processes.

14. The computer-usable non-transitory medium of claim 13 wherein said second clock object maintains a count of statically-sensitive processes, wherein said second software clock object is disabled when said count is zero and no dynamically-sensitive processes are sensitive to said second software clock object.

15. A computer system comprising:
a processor; and
a memory unit coupled to said processor, said memory unit containing instructions that when executed implement a computer-implemented method for simulating a system of devices, said method comprising:

executing a system model comprising a plurality of software modules including a first module representing a first device of said devices and a second module representing a second device of said devices, wherein a first software clock object is associated with said first module and a second software clock object is associated with said second module and wherein said second software clock object advances fewer clock cycles per unit of simulation time during a simulation relative to said first software clock object, said simulation performed using said system model;

during said simulation, monitoring said first module to determine if said first module is active and monitoring said second module to determine if said second module is active; and during said simulation, using said second software clock object to drive both said first and second modules when both said first and second modules are active, using said second software clock object to drive said second module when said second module is active but said first module is inactive, and disabling said second software clock object and using said first software clock object to drive said first module when said first module is active but said second module is inactive.

16. The computer system of claim 15 wherein said method further comprises monitoring processes in said simulation that are sensitive to said second software clock object, wherein said second software clock object is disabled when no processes are sensitive to said second software clock object.

17. The computer system of claim 15 wherein said method further comprises receiving an indication that a process in said simulation that is sensitive to said second software clock object is no longer sensitive to said second software clock object.

18. The computer system of claim 15 wherein said method further comprises enabling said second software clock object for said second module in response to said second module becoming active.

19. The computer system of claim 15 wherein said method further comprises receiving an indication that a process in said simulation is waiting for a clock event from said second software clock object.

20. The computer system of claim 15 wherein said system model is constructed in a language substantially compliant with SystemC and comprises statically-sensitive processes and dynamically-sensitive processes.

21. The computer system of claim 20 wherein said second clock object maintains a count of statically-sensitive processes, wherein said second software clock object is disabled when said count is zero and no dynamically-sensitive processes are sensitive to said second software clock object.

* * * * *